United States Patent
Park et al.

(10) Patent No.: US 8,441,049 B2
(45) Date of Patent: May 14, 2013

(54) FLAT PANEL DISPLAY DEVICE COMPRISING POLYSILICON THIN FILM TRANSISTOR AND METHOD OF MANUFACTURING THE SAME

(75) Inventors: Ji-Yong Park, Suwon-si (KR); Jae-Bon Koo, Yongin-si (KR); Hye-Hyang Park, Suwon-si (KR); Ki-Yong Lee, Yongin-si (KR); Ul-Ho Lee, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 1101 days.

(21) Appl. No.: 10/872,495

(22) Filed: Jun. 22, 2004

(65) Prior Publication Data
US 2005/0012152 A1  Jan. 20, 2005

(30) Foreign Application Priority Data

Jul. 16, 2003 (KR) .................. 10-2003-0048889
Jul. 23, 2003 (KR) .................. 10-2003-0050772

(51) Int. Cl.
*H01L 29/76* (2006.01)
(52) U.S. Cl.
USPC .................. 257/288; 257/296; 257/E27.062; 257/E27.064
(58) Field of Classification Search .................. 257/350, 257/204, 274, 288, 296, E27.062, E27.064, 257/E27.067, E27.108; 438/153, 154, 188, 438/199, 200
See application file for complete search history.

(56) References Cited

U.S. PATENT DOCUMENTS

| | | | |
|---|---|---|---|
| 5,615,935 A | 4/1997 | Beyer et al. .................. 303/195 |
| 6,124,603 A | 9/2000 | Koyama et al. ................ 257/66 |
| 6,177,391 B1 | 1/2001 | Zafar ............................ 510/131 |
| 6,322,625 B2 | 11/2001 | Im .................................. 117/43 |
| 6,448,718 B1 * | 9/2002 | Battersby ................... 315/169.3 |
| 6,492,268 B1 | 12/2002 | Pyo ............................... 438/687 |
| 6,512,247 B1 | 1/2003 | Suzuki et al. |
| 6,746,942 B2 * | 6/2004 | Sato et al. .................... 438/586 |
| 6,900,464 B2 * | 5/2005 | Doi et al. ...................... 257/72 |
| 6,965,122 B2 * | 11/2005 | Suzuki et al. .................. 257/72 |
| 2003/0124778 A1 | 7/2003 | Doi |
| 2005/0202654 A1 * | 9/2005 | Im ................................ 438/487 |

FOREIGN PATENT DOCUMENTS

| | | |
|---|---|---|
| CN | 1354495 | 6/2002 |
| JP | 10-069011 A1 | 3/1998 |
| JP | 11-265000 | 9/1999 |
| KR | 1020020024514 A1 | 3/2002 |

OTHER PUBLICATIONS

Chinese Office Action dated Apr. 25, 2008.

* cited by examiner

*Primary Examiner* — Matthew Landau
*Assistant Examiner* — Colleen E Snow
(74) *Attorney, Agent, or Firm* — H.C. Park & Associates, PLC

(57) ABSTRACT

The present invention relates to a flat panel display device comprising a polysilicon thin film transistor and a method of manufacturing the same. Grain sizes of polysilicon grains formed in active channel regions of thin film transistors of a driving circuit portion and a pixel portion of the flat panel display device are different from each other. Further, the flat panel display device comprising P-type and N-type thin film transistors having different particle shapes from each other.

15 Claims, 13 Drawing Sheets

DATA LINE  GATE LINE (A)

(B)

FLAT PANEL DISPLAY DEVICE COMPRISING POLYSILICON THIN FILM TRANSISTOR AND METHOD OF MANUFACTURING THE SAME

This application claims the benefit of Korean Patent Application No. 2003-48889, filed on Jul. 16, 2003, and Korean Application No. 2003-50772, filed on Jul. 23, 2003, which are hereby incorporated by reference for all purposes as if fully set forth herein.

BACKGROUND OF THE INVENTION

1. Field of the Invention

The present invention relates to a flat panel display device comprising a polysilicon thin film transistor and a method of manufacturing the same. More particularly, it relates to a flat panel display device comprising polysilicon thin film transistors having different sizes and shapes of polysilicon grains formed in an active channel region of a thin film transistor.

2. Discussion of the Related Art

Bonding defects such as dangling bonds exist at grain boundaries of the polysilicon used in active channel regions of thin film transistors (TFTs). These defects have been known to act as traps for electric charge carriers.

TFT characteristics such as threshold voltage (Vth), sub-threshold slope, charge carrier mobility, leakage current, device stability, and the like are affected either directly or indirectly by the size, uniformity, number, position and direction of the grains and/or grain boundaries in the channel region of TFTs. For example, the position of the grains is also capable of affecting either directly or indirectly the uniformity of the TFTs manufactured for an active matrix display.

Currently the number of grain boundaries (which may be referred to as "primary" grain boundaries) that are included in the active channel region of the TFTs over an entire substrate may be equal to or different from each other. Referring to FIGS. 1A and 1B, this number depends on the size of the grains, slope angle $\theta$, dimensions of the active channel region (e.g., length L, width W), and position of each TFT on the substrate.

As shown in FIGS. 1A and 1B, the number of primary grain boundaries capable of being included in the active channel region may be represented as $N_{max}$. This number depends on the grain sizes (Gs), the active channel dimensions (L×W), the slope angle ($\theta$), and on the position on the TFT substrate. The maximum number of primary grain boundaries is $N_{max}$, and is 3, in the case of FIG. 1A. In the case of FIG. 1B the maximum number of primary grain boundaries becomes $N_{max}-1$, and is 2.

Excellent TFT characteristics can be obtained when TFTs included in the active channel regions over the substrate have the $N_{max}$ number of primary grain boundaries. The uniformity of the device increases as the number of TFTs having an equal number of the grain boundaries can be obtained.

In contrast, when the number of the TFT comprising a $N_{max}$ number of the primary grain boundaries is equal to the number of the TFT comprising $N_{max}-1$ of primary grain boundaries, the uniformity is worse.

In this regard, sequential lateral solidification (SLS) crystallization technology is capable of forming large silicon grains of polycrystalline or single crystal particles on the substrate as shown in FIG. 2A and FIG. 2B. It has been reported that TFTs manufactured using SLS crystallization technology have similar characteristics to TFTs manufactured with single crystals.

Numerous TFTs for driver and pixel arrays are needed in the manufacture of an active matrix display. For example, an active matrix display having a SVGA resolution level may be manufactured with about one million pixels. Also, when using a liquid crystal display (LCD) each pixel requires one TFT and when using an organic luminescent material (e.g., organic electroluminescent device) each pixel requires at least two TFTs. Therefore, one million or two million TFTs may be required in the active matrix display. Accordingly, due to the large number of required TFTs it is impossible to have uniform number of grains grown and manufactured in the uniform directions in the active channel regions for each of these TFTs.

U.S. Pat. No. 6,322,625 discloses technology for converting amorphous silicon into polysilicon. This patent is incorporated by reference as if fully set forth herein. Additionally, the reference discloses crystallizing selected regions on the substrate by using SLS technology. The amorphous silicon may be deposited with plasma enhanced chemical vapor deposition (PECVD), low pressure chemical vapor deposition (LPCVD), sputtering techniques, or the like.

Referring to FIG. 2A and FIG. 2B, the selected region for crystallization may be substantially wide region when compared with the active channel region. That is, the selected region may be several μms by several μms. Additionally, a laser used in the crystallization technology may have a beam area of several mm by several tens of mm. The laser may use a stepper or a stage for shifting the laser beam in order to crystallize the amorphous silicon in the entire region or a selected region on the substrate.

Misalignment of the laser beam during operation, for example, misalignment between regions during irradiation may cause misalignment in the active channel regions of the numerous TFTs. As a result a number of the grain boundaries may be different in the various TFTs over the entire substrate or in the driver and pixel cell regions, thereby creating unpredictable characteristics. These non-uniformities may exert a negative influence on the active matrix display device.

U.S. Pat. No. 6,177,391 is hereby incorporated by reference as if fully set forth herein. As in U.S. Pat. No. 6,177,391 and referring to FIG. 3A, when the direction of an active channel is parallel with a grain direction grown by SLS crystallization a barrier effect of the grain boundaries with respect to the direction of an electric charge carrier is minimized. As a result, TFT characteristics similar to single crystal silicon can be obtained. Referring to FIG. 3B, when the active channel direction and the grain direction constitute about a 90° angle a number of the grain boundaries act as traps for electric charge carriers and the TFT characteristics are remarkably lowered.

Typically the active channel direction and the grain direction of TFTs in a driver circuit and the TFTs in a pixel cell region may have a 90° angle when the active matrix display is manufactured. Referring to FIG. 3C, in order to improve the uniformity characteristics between TFTs and without largely decreasing the characteristics of each TFT the direction of the active channel region with respect to the grain growth direction is manufactured with an inclined slope of about 30° to 90°. As a result, the uniformity of the device may be increased.

This method, however, has a possibility of having primary grain boundaries in the active channel region by using a limited size of grain formed by the SLS crystallization technology. Thus, a problem of unpredictability with non-uniformities exists and causes different characteristics among the TFTs.

Additionally, the display device may employ complementary metal oxide semiconductor (CMOS) thin film transistor (TFT) in the circuits. Generally, an absolute value of the threshold voltage of the TFT is larger than that of a MOS transistor using the single-crystal semiconductor. Also, the absolute value of a threshold voltage of an N-type TFT is substantially different from the absolute value of a P-type TFT. For example, when the threshold voltage of the N-type TFT is 2V the threshold voltage of the P-type TFT is −4V.

Therefore, these substantial differences between the absolute values of the threshold voltages of the P-type TFT and the N-type TFT exert negative influences on the operation of the circuit, especially, by acting as a large obstacle in decreasing a driving voltage. For example, generally a P-type TFT has a large absolute threshold voltage value and is not suitably operated at low driving voltages. That is, the P-type TFT functions as a passive device at low driving voltages such as a register and is not operated properly. A substantially high voltage is required in order to properly operate the P-type TFT as the active device.

This may be exaggerated as work functions between the gate electrode and the intrinsic silicon are different. For example, the gate electrode may be of aluminum and has a work function below 5 eV. As the work functions between the gate electrode and an intrinsic silicon semiconductor become smaller such as −0.6 eV the threshold voltage of the P-type TFT approaches a negative value and the threshold voltage of the N-type TFT approaches 0V. Accordingly, the N-type TFT may shift to an "on" state of operation.

In the state as described above, the absolute values of the threshold voltages of the N-type TFT and the P-type TFT are preferably substantially equal to each other. In the case of a conventional single-crystal semiconductor integrated circuit technology, the threshold voltage may be controlled using N-type or P-type impurities. That is, these impurities may be doped into the semiconductor at very low concentrations of about or below $10^{18}$ atom/cm$^2$. Accordingly, the threshold voltages are precisely controlled below 0.1V by the impurity doping of $10^{15}$ to $10^{18}$ atom/cm$^2$ concentration.

In contrast, when using a semiconductor that are not a single-crystal semiconductor, the shift of the threshold voltages is not observed by adding impurities with a concentration of about or below $10^{18}$ atom/cm$^2$. In addition, when the concentration of the impurities is higher than $10^{18}$ atom/cm$^2$ the threshold voltage is rapidly varied and conductivity becomes a P-type or an N-type as the polycrystalline silicon contains many defects. Since a defect concentration is $10^{18}$ atom/cm$^2$, the added impurities cannot be trapped and/or activated by this defect. Furthermore, the concentration of the impurities is larger than that of the defects, and excess impurities are activated that may cause the conductivity type to be varied from an N-type or P-type.

The related art tries to solve these problems, for example, in U.S. Pat. Nos. 6,492,268, 6,124,603 and 5,615,935, by providing shorter channel lengths of the P-type TFTs than the channel lengths of the N-type TFTs. These patents cited herein are incorporated by reference herein in their entirety. However, these patents also create problems by complicating the manufacturing process since the channel lengths are manufactured with different lengths from each other.

SUMMARY OF THE INVENTION

Accordingly, the present invention is directed to a flat panel display device comprising polysilicon thin film transistors and method of manufacturing the same that substantially obviates one or more of the problems due to limitations and disadvantages of the related art.

An advantage of the present invention is to provide CMOS TFTs having an absolute threshold voltages of the P-type TFTs and the N-type TFTs that are substantially similar to each other and having high current mobilities by adjusting the shape of polysilicon grains in the active channel regions of the TFTs.

Another advantage is to provide TFTs having good characteristics.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a pixel portion including a plurality of thin film transistors, wherein the plurality of thin film transistors are driven by signals applied through a gate line and a data line. A driving circuit portion having at least one thin film transistor to apply the signals to the pixel portion and connected to the gate line and the data line, wherein an average number polysilicon grains per unit area formed in an active channel of the at least one thin film transistor is less than an average number of polysilicon grains formed in an active channel of one of the plurality of thin film transistors included in the pixel portion.

In another aspect of the present invention, a method of manufacturing a flat panel display device, comprising forming an amorphous silicon film. Crystallizing the amorphous silicon film with a laser to form a polysilicon film, wherein irradiated energy of the laser on the amorphous silicon layer in an active channel region of a pixel portion is smaller than irradiated energy of the laser on the amorphous silicon layer in an active channel region of a driving circuit portion.

In yet another aspect of the present invention, a complementary metal oxide semiconductor (CMOS), comprising a P-type thin film transistor having a polysilicon grain structure of a substantially anisotropic shape formed in an active channel region. An N-type thin film transistor having a polysilicon grain structure of a substantially isotropic shape formed in an active channel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1A:
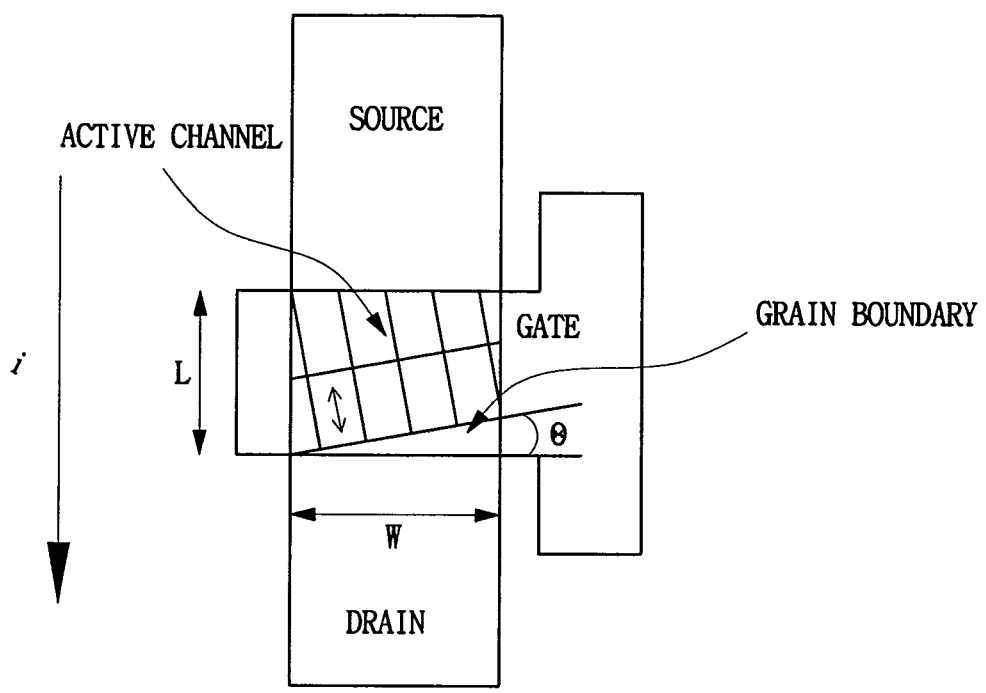
FIG. 1A shows a schematic cross-sectional view of a TFT having two primary grain boundaries.
Figure 1B:
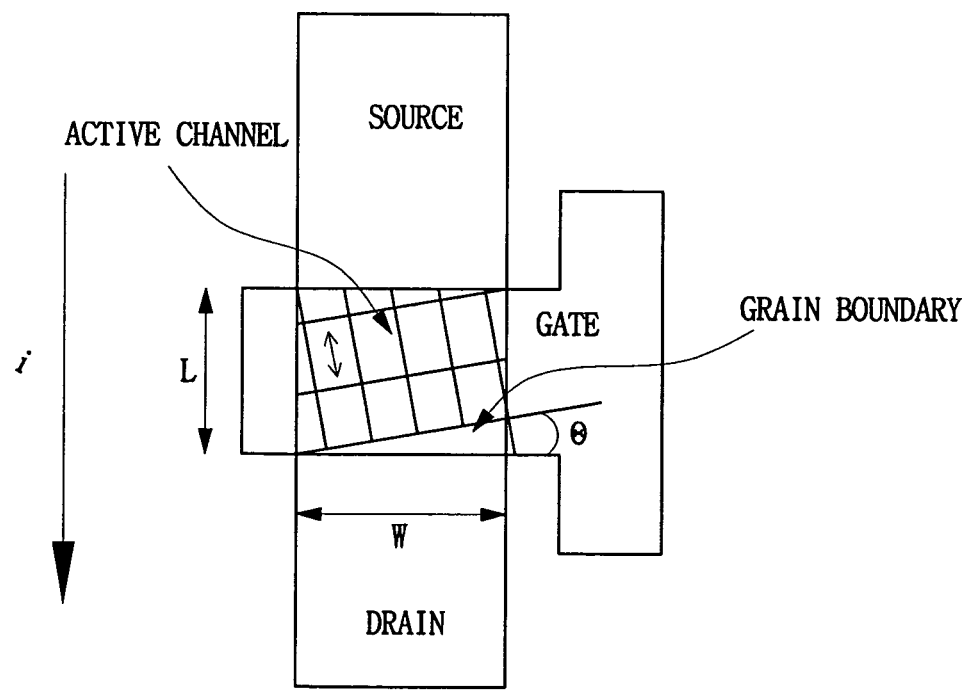
FIG. 1B shows a schematic cross-sectional view of a TFT having three primary grain boundaries, with respect to an equal grain size (Gs) and active channel dimensions (L×W)
Figure 2A:
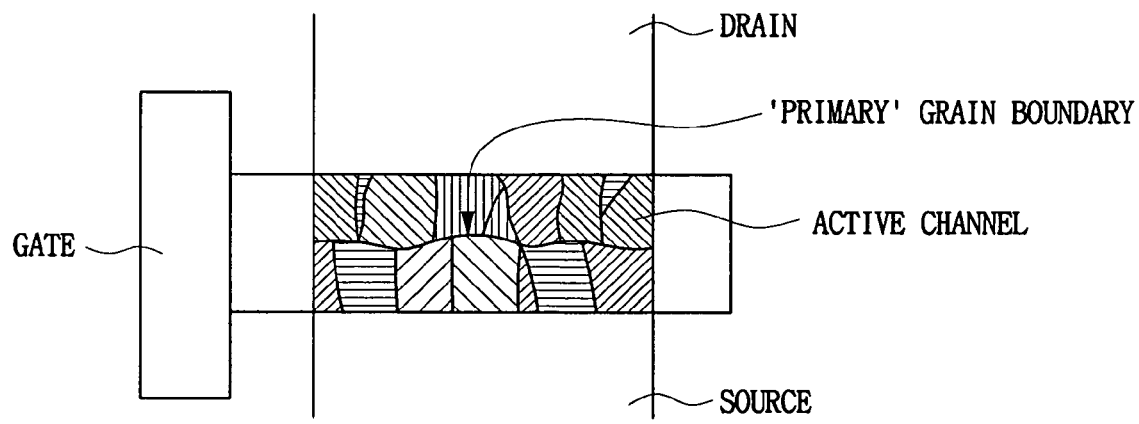
FIGS. 2A and 2B show schematic cross-sectional views of active channels of TFTs comprising large particle sizes of silicon grains formed by an SLS crystallization method according to the related art.
Figure 2B:
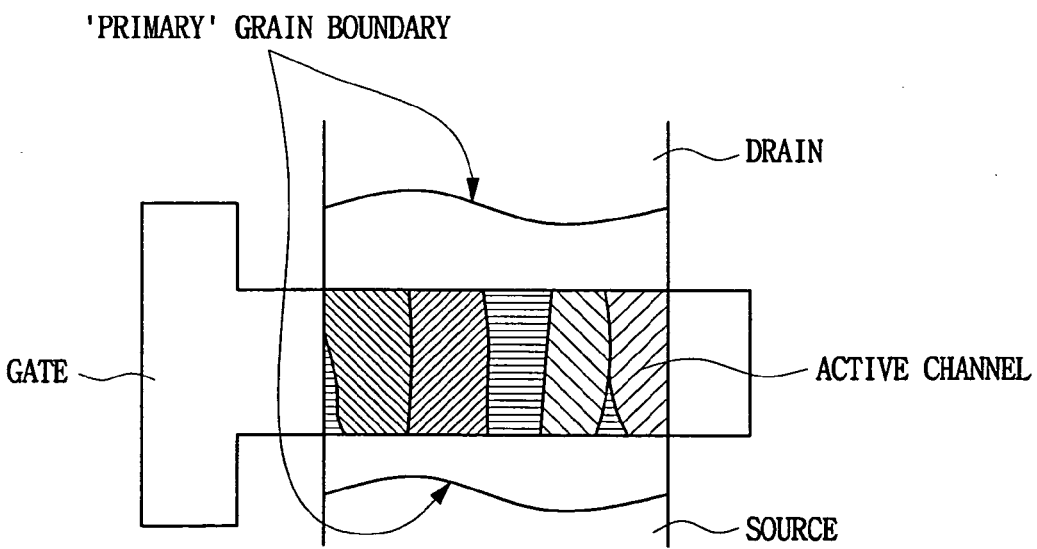
Figure 3A:
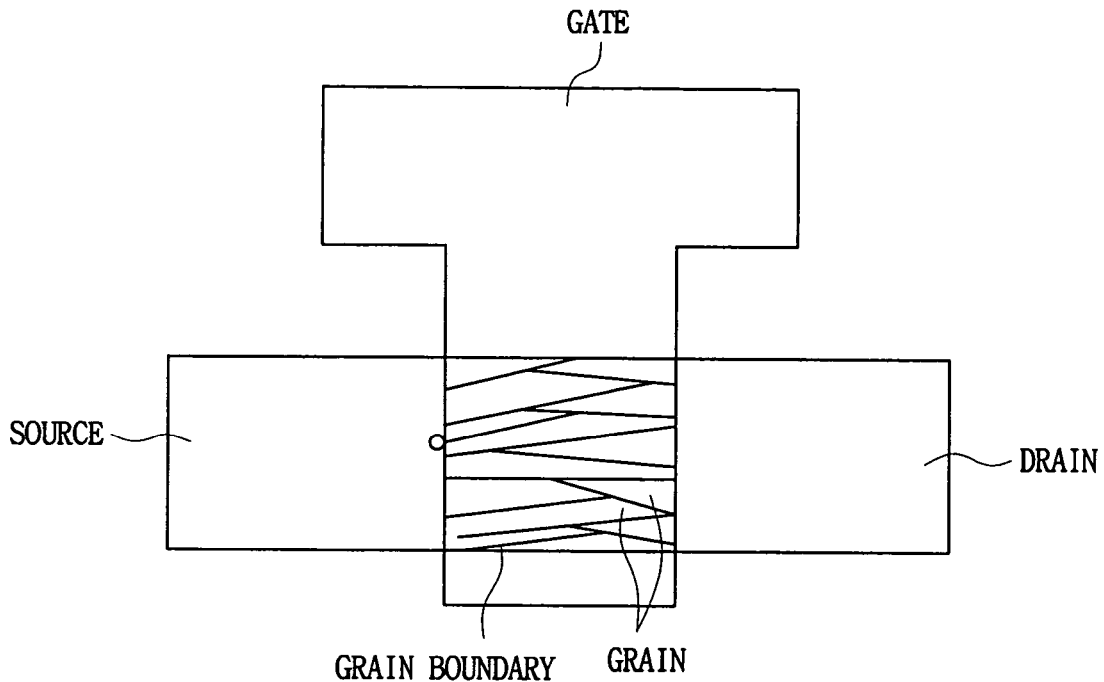
FIGS. 3A, 3B, and 3C show schematic cross-sectional views of active channels of TFTs manufactured by the related art.
Figure 3B:
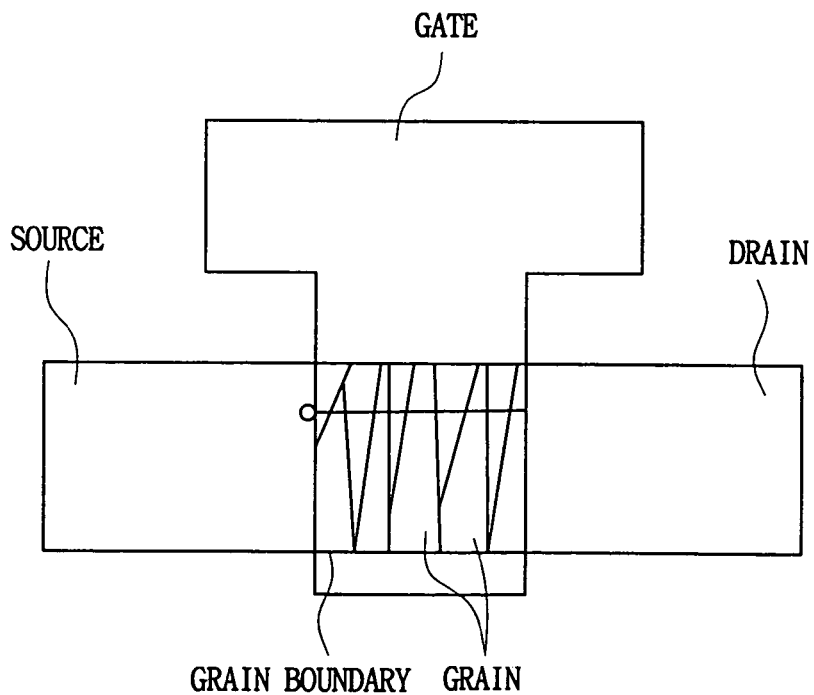
Figure 3C:
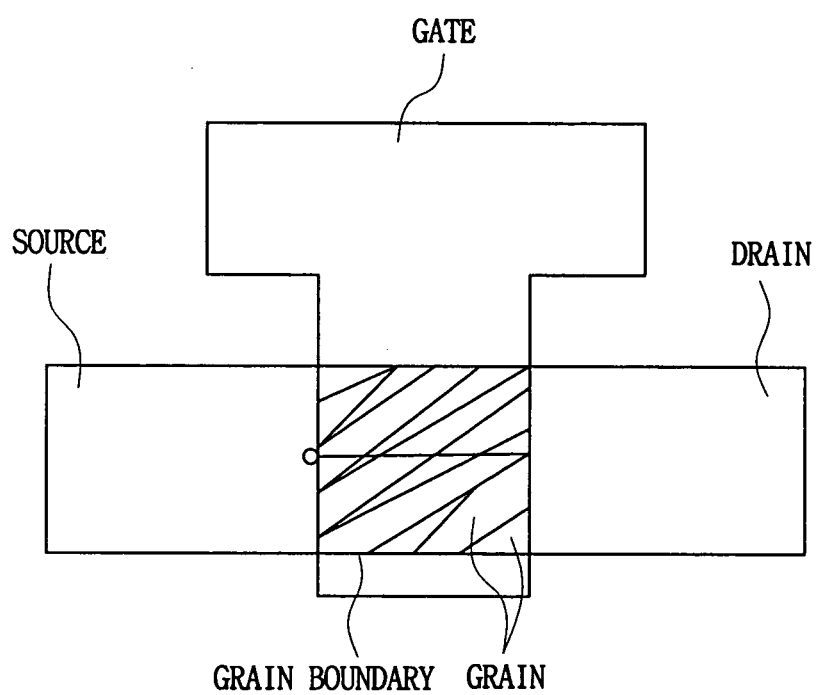

Reference will now be made in detail to embodiments of the present invention, examples of which are illustrated in the accompanying drawings. This invention, however, may be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like reference numbers refer to like elements throughout the specification.

In the present invention, "grain size" defines a distance between identifiable grain boundaries. Of course, the calculated distances are subject to conventional error ranges.

Grain boundaries existing in the active channel region may exert negative influences on the TFT characteristics. These negative influences are inevitable due to defects in the process, process limitations, and lack of precision in the formation of polysilicon thin films.

Furthermore, depending upon the size and direction of a grain, dimensions of the active channel, and the like, the number of grain boundaries included in the TFTs active channel regions that are manufactured on a driving circuit substrate or on a display substrate may be different. As a result, the characteristics of the manufactured TFTs may become irregular and at an extreme may not be drivable.

The present invention is directed towards providing a flat panel display device comprising TFTs such that the number of grains and/or grain boundaries existing in the active channel region of the TFT are adjustable.

Figure 4A:
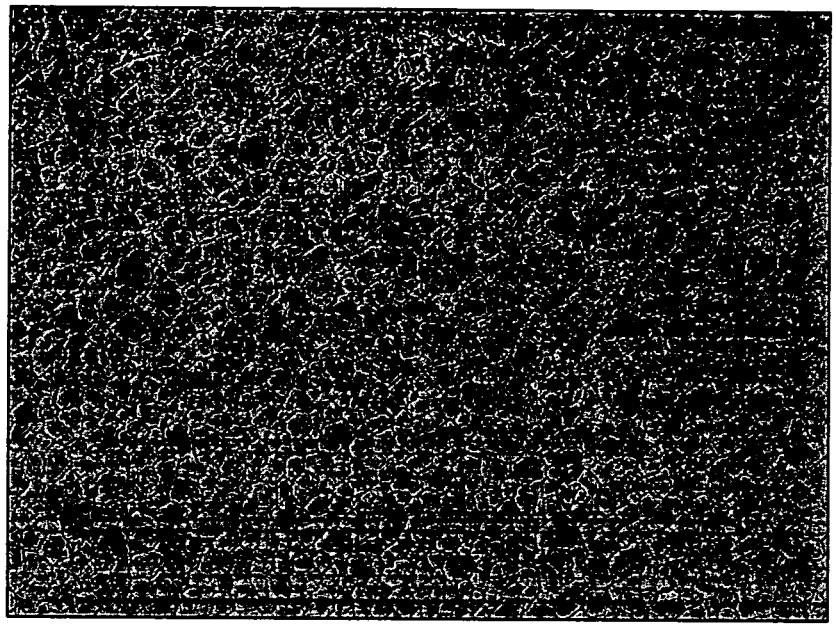
FIGS. 4A and 4B show plan views of polysilicon grains formed in active channel regions of a pixel portion and a driving circuit portion in accordance with an embodiment of the present invention.
Figure 4B:
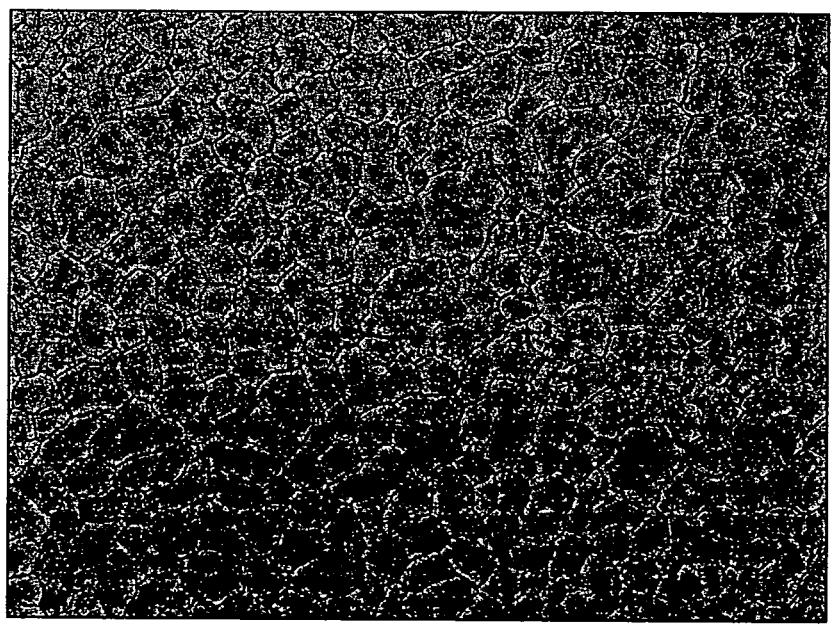

FIGS. 4A and 4B show plan views illustrating polysilicon grains formed in active channel regions of a pixel portion (FIG. 4A) and a driving circuit portion (FIG. 4B) of a flat panel display device in accordance with an embodiment of the present invention.

Referring to FIGS. 4A and 4B, polysilicon may be manufactured by crystallization of amorphous silicon. The crystallization may be accomplished, for example, by using laser crystallization methods such as an excimer laser annealing method (ELA method), sequential lateral solidification method (SLS method), and the like.

During the crystallization, energy of the laser irradiated on the driving circuit portion is larger than energy of the laser irradiated on the pixel portion. For example, when using the ELA method, the driving circuit portion is irradiated with a laser having energy ranging from about 320 to 540 mJ/cm$^2$ and the pixel portion is irradiated with a laser having energy ranging of from about 200 to 320 mJ/cm$^2$. Accordingly, the average particle size per unit area of the polysilicon formed in the pixel portion is smaller than the average particle size in the driving circuit portion.

When polysilicon is manufactured by this method and used for TFTs having at least one gate, the average number of grains per unit area is greater in the pixel portion region than in the driving circuit portion region. As a result, the pixel portion region has more grain boundaries than the driving circuit portion region.

Figure 5:
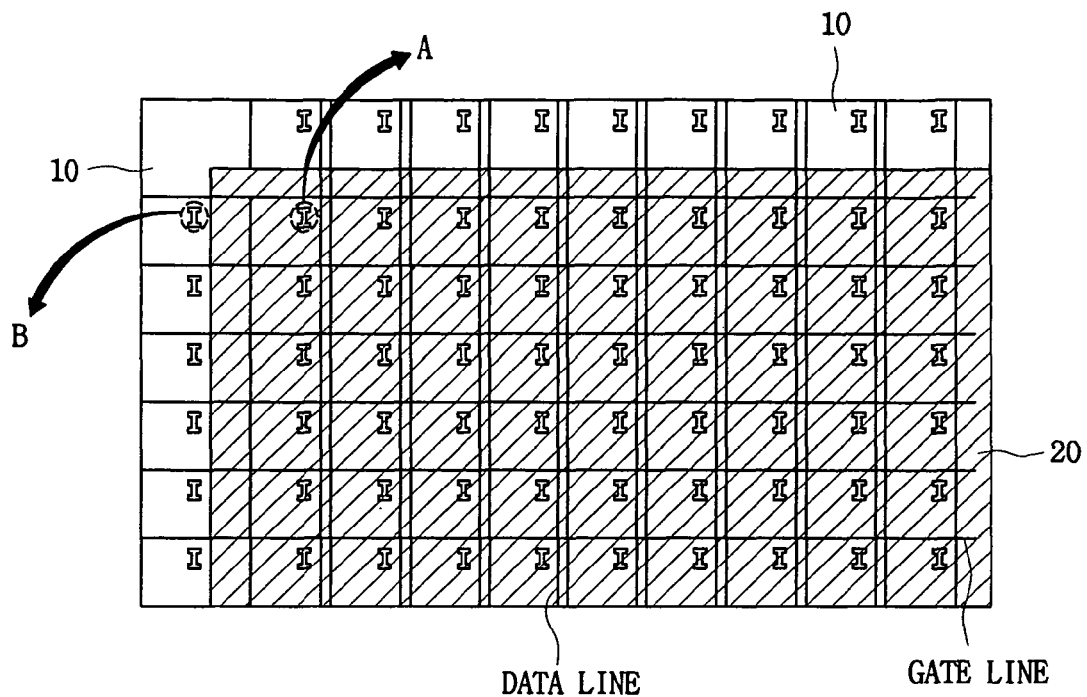
FIG. 5 shows a plan view of a flat panel display device in accordance with an embodiment of the present invention, wherein the number of a polysilicon grains per unit area formed in an active channel region of a TFT included in a driving circuit portion is less than the number of a polysilicon grains per unit area formed in an active channel region of a TFT included in a pixel portion.
Figure 5:
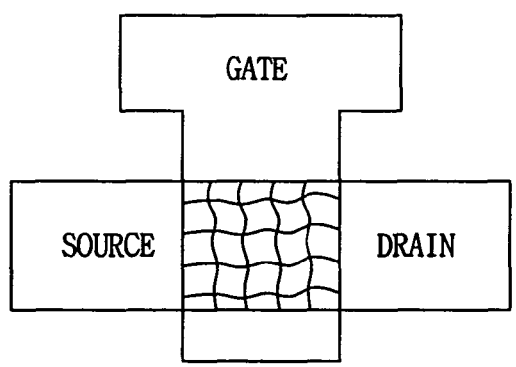
Figure 5:
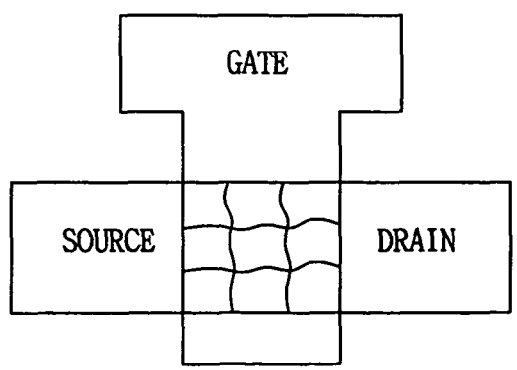

FIG. 5 shows a plan view illustrating a flat panel display device in accordance with an embodiment of the present invention. In this configuration, the number of grains per unit area in the active channel region of TFTs in a driving circuit portion is less than the number of grains per unit area in the active channel region of TFTs in a pixel portion.

The (B) portion of FIG. 5 illustrates the number of polysilicon grains formed in the active channel region of a TFT included in the driving circuit portion 10. The (A) portion of FIG. 5 illustrates the number of polysilicon grains formed in the active channel region of a TFT included in the pixel portion. The number of the polysilicon grains in the active channel region of the driving circuit portion is formed to be less than at least the number of the polysilicon grains formed in the active channel region of the pixel portion 20.

Additionally, in at least one of the TFTs, the polysilicon grain sizes formed in the active channel region of the pixel portion 20 are more uniform than the polysilicon grain sizes formed in the active channel region in the driving circuit portion 10. Additionally, the particle sizes are smaller in the pixel portion, that is, the area of the grain boundary surrounding one particle is smaller. Accordingly, the number and area of the grain boundaries included in the active channel of the pixel portion is increased. Also, the average particle size of the polysilicon grains included in the active channel region of each gate region is larger in the driving circuit portion than in the pixel portion.

Accordingly, the electric characteristics, such as, current mobility is better in the driving circuit portion than in the pixel portion. Also, the current uniformity is better in the pixel portion as the particle sizes are more uniform in the pixel portion than in the driving circuit portion.

The flat panel display device comprising the polysilicon thin films formed by the above-mentioned method may be an organic electroluminescent display device, liquid crystal display device, or the like. Optionally, the TFTs of the present invention are capable of having at least two gates.

FIGS. 6A, 6B, 6C, 6D, 6E, 6F and 6G show processes for manufacturing CMOS TFTs used in a liquid crystal display device in accordance with an embodiment of the present invention.

Figure 6A:
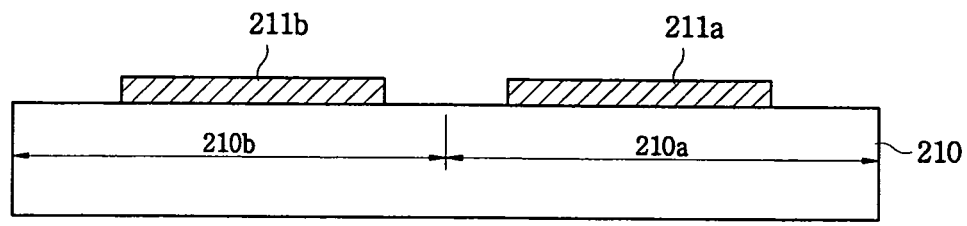
FIGS. 6A, 6B, 6C, 6D, 6E, 6F, and 6G show process views for manufacturing a CMOS TFT used in a liquid crystal display device in accordance with an embodiment of the present invention.

Referring to FIG. 6A, a polysilicon film is deposited on the substrate 210 and is provided with an N-type TFT region 210a and a P-type TFT region 210b. A first mask (not shown) is located on the substrate 210 to etch the polysilicon film, thereby forming polysilicon patterns 211a and 211b over the N-type TFT region 210a and the P-type TFT region 210b, respectively. The channel regions of the N-type TFT and the P-type TFT are formed to have substantially the same width.

When the polysilicon patterns 211a and 211b are formed, shapes of the polysilicon grains formed in the active channels over regions 210b and region 210a may be formed to have different shapes from each other. More particularly, the polysilicon grains formed in the active channel of the N-type TFT region have a substantially isotropic particle shape and the polysilicon grains formed in the active channel of the P-type TFT region have a substantially anisotropic particle shape.

In the present invention, the polysilicon pattern is formed by crystallizing the amorphous silicon with a laser, thereby forming the polysilicon film. For example, the crystallization may be accomplished by any combination of laser crystallization methods such as an excimer laser annealing method (ELA method), sequential lateral solidification method (SLS method), and the like.

In this embodiment, the active channel region of the P-type TFT is formed by using the SLS method and the active channel region of the N-type TFT is formed by using an ELA method.

Optionally, the same laser crystallization technique may be employed to form the polysilicon in each region. When using the same laser technique, the laser is irradiated in the active channel region of the P-type TFT at a higher energy level than the energy of the laser being irradiated in the active channel region of the N-type TFT.

The average size of the grain particles of the P-type TFT may be larger than that of the N-type TFT. For example, the average grain size may be more than 2 μm in the active channel region of the P-type TFT and less than 1 μm in the active channel region of the N-type TFT.

Figure 6B:
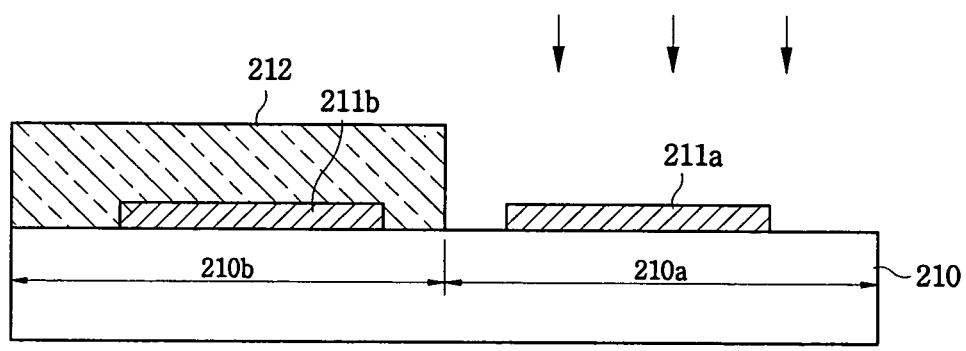

As shown in FIG. 6B, after the polysilicon pattern is formed, channel doping is performed with an N-type dopant in order to give conductivity to the N-type TFT. The implantation may be performed by using a photoresist 212 as a mask. The implantation is preformed after the polysilicon pattern 211a of the channel region 210a in the N-type TFT is exposed.

The present invention may also include any number of conventional TFT structures for the source and drain regions, for example, a lightly doped drain structure (LDD structure), an offset structure, or the like may be utilized.

The present embodiment, utilizes the following processes with respect to the CMOS TFT having a LDD structure. The method of fabricating this structure will now be described.

Figure 6C:
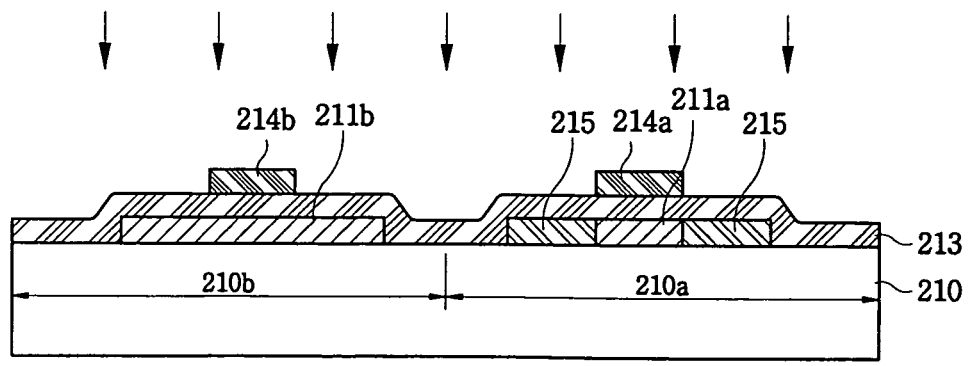

Referring to FIG. 6C, after the photoresist 212 is removed a gate insulating film 213 is formed on the substrate 210 and gate electrode material is deposited on the gate insulating film 213. The gate electrode material is etched on the substrate 210 by using a mask to form gate electrodes 214a and 214b of the N-type TFT and the P-type TFT, respectively. To form the LDD structure, N-type low concentration impurities are ion implanted in the polysilicon pattern 211a of the N-type TFT region, thereby forming low concentration source and drain regions 215 at both sides of the gate electrode 214a.

Figure 6D:
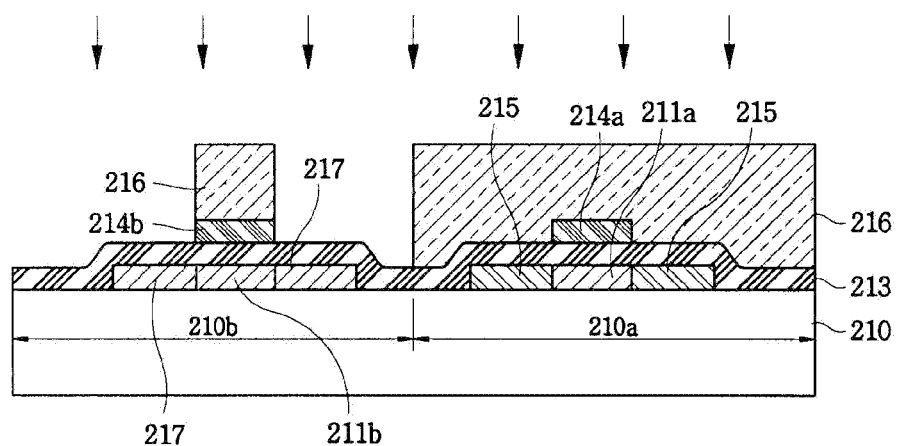

Referring to FIG. 6D, a photoresist is deposited on the entire surface of the substrate 210. A photolithography process is performed to prevent ion impurity implanting into the N-type TFT region 210a. At the same time, a mask 216 is used for forming source and drain regions of the P-type TFT is formed. Using this mask a high concentration P-type impurity is ion implanted into the polysilicon pattern 211b of the P-type TFT region 210b, thereby forming a high concentration source and drain regions 217 of the P-type TFT.

Figure 6E:
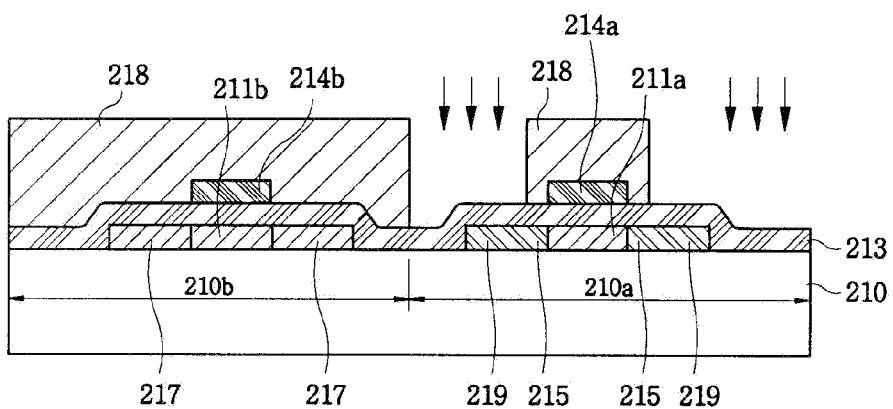

Referring to FIG. 6E, the mask is removed and another photoresist is deposited on the substrate 210. A photolithography process is performed to form a mask 218, thereby preventing impurities from being ion implanted into the gate electrode of the N-type TFT and the P-type TFT region 210a. Using the mask 218, N-type high concentration impurity ions are implanted into the polysilicon pattern 211a of the N-type TFT region 210a, thereby forming a high concentration source and drain regions 219.

Figure 6F:
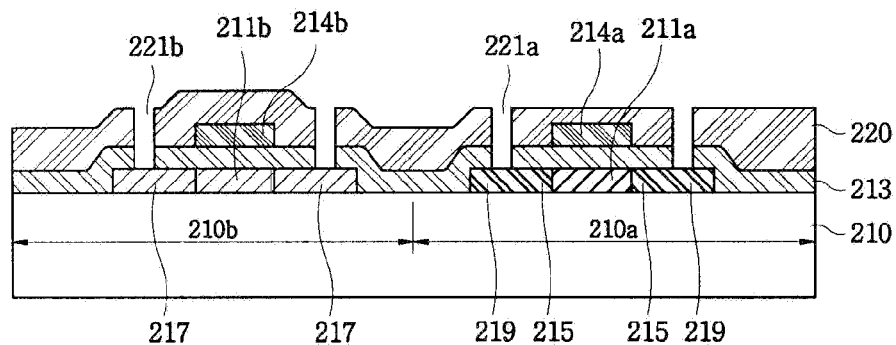

Referring to FIG. 6F, after the mask 218 is removed, an interlayer insulating film 220 is formed on the entire surface of the substrate 210. A mask (not shown) is positioned on the substrate 210 to etch contact holes 221a and 221b into the interlayer insulating film 220. The contact holes expose the source/drain regions 217 and 219 of the N-type TFT and the P-type TFT.

Figure 6G:
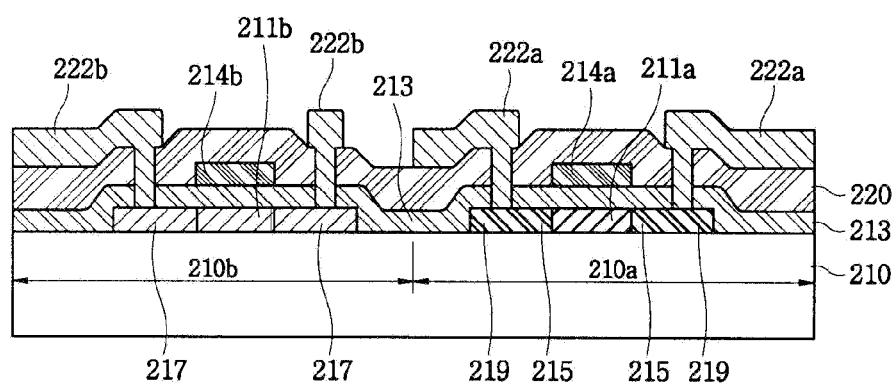

Referring to FIG. 6G, a conductive metal material is deposited on the entire surface of the substrate 210 for forming source and drain electrodes. A mask (not shown) is used in order to etch the conductive metal material to form source and drain electrodes 222a and 222b of the N-type TFT and the P-type TFT, respectively. Accordingly, a CMOS TFT is provided with the N-type TFT having the LDD structure and the P-type TFT has a conventional source and drain structure.

Figure 7A:
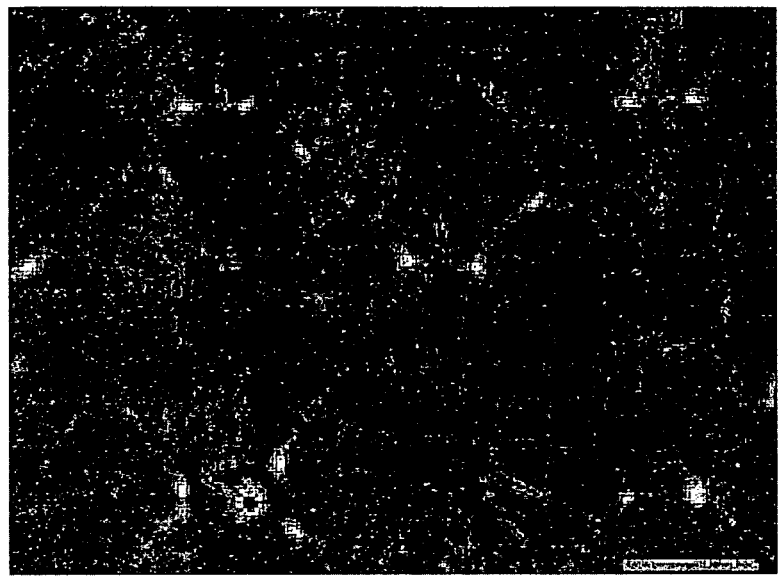
FIGS. 7A, 7B, and 7C shows an anisotropic shape crystalline particle shape of polysilicon thin films included in active channel regions of a P-type TFT and an N-type TFT having an LDD structure of FIG. 6G.
Figure 7B:
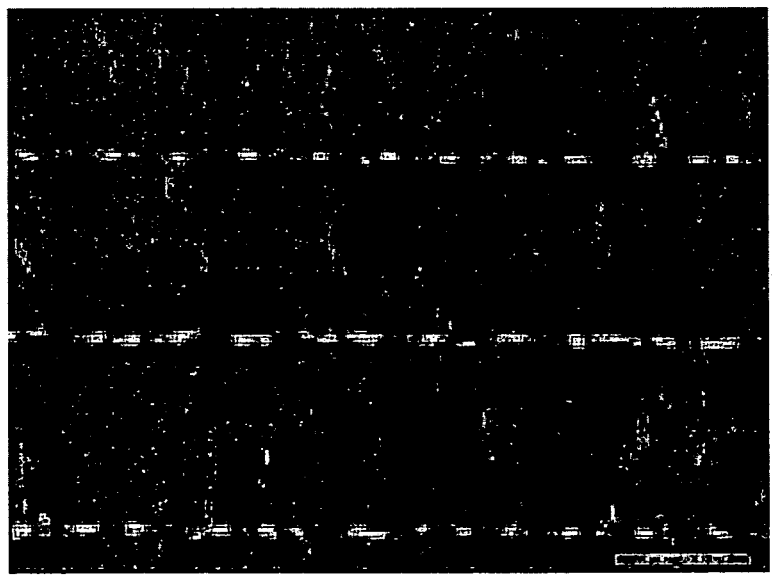
Figure 7C:
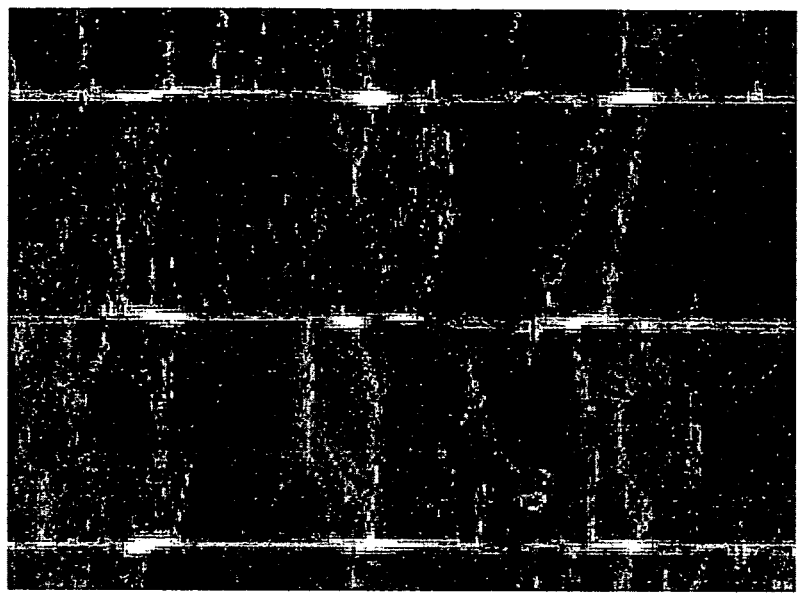
Figure 7D:
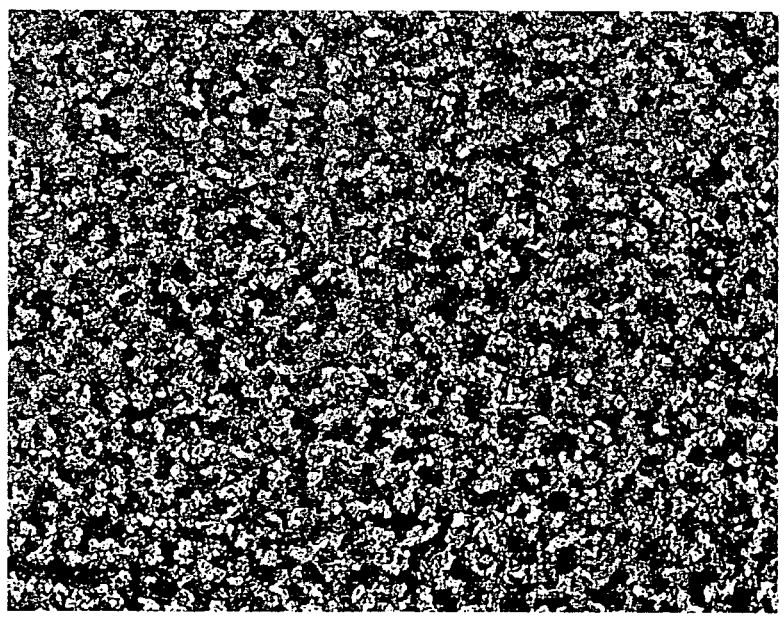
FIG. 7D shows an isotropic particle shape of FIG. 6G.

FIGS. 7A, 7B, 7C and 7D show views illustrating crystalline particle shapes of polysilicon films included in active channel regions of the P-type TFT and the N-type TFT having the LDD structure of FIG. 6G. FIGS. 7A, 7B and 7C show the anisotropic particle shapes and FIG. 7D illustrates the isotropic particle shape.

Figure 8A:
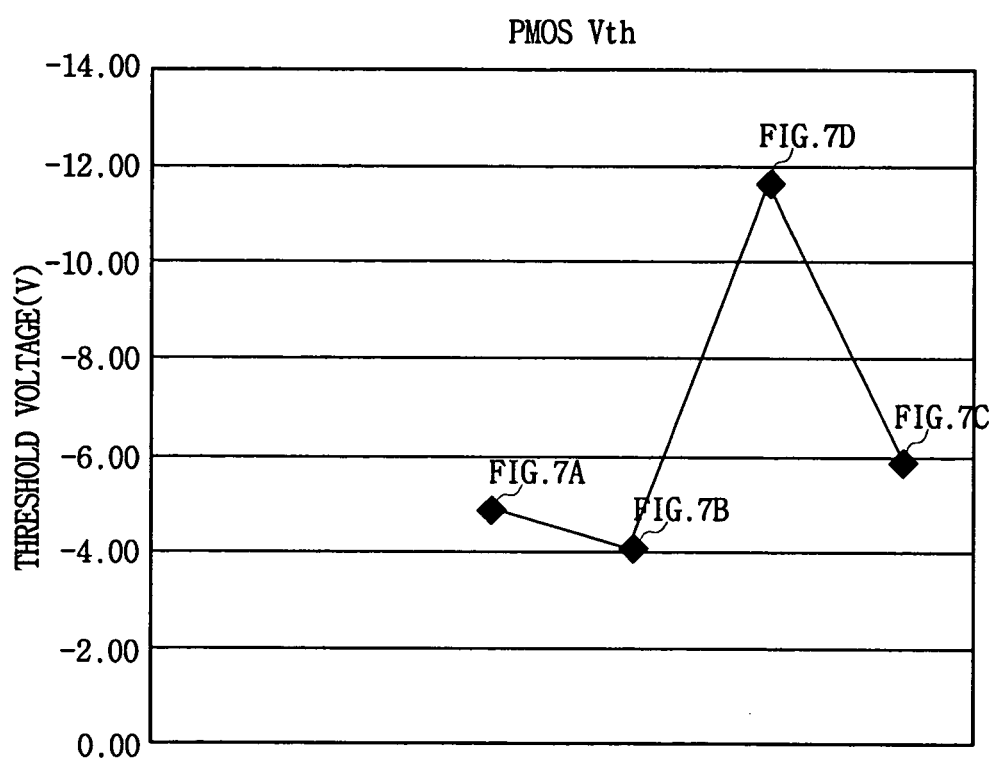
FIG. 8A shows a graph illustrating threshold voltage values of the P-type TFT employing the polysilicon having the crystalline shapes of FIGS. 7A, 7B, 7C and 7D.
Figure 8B:
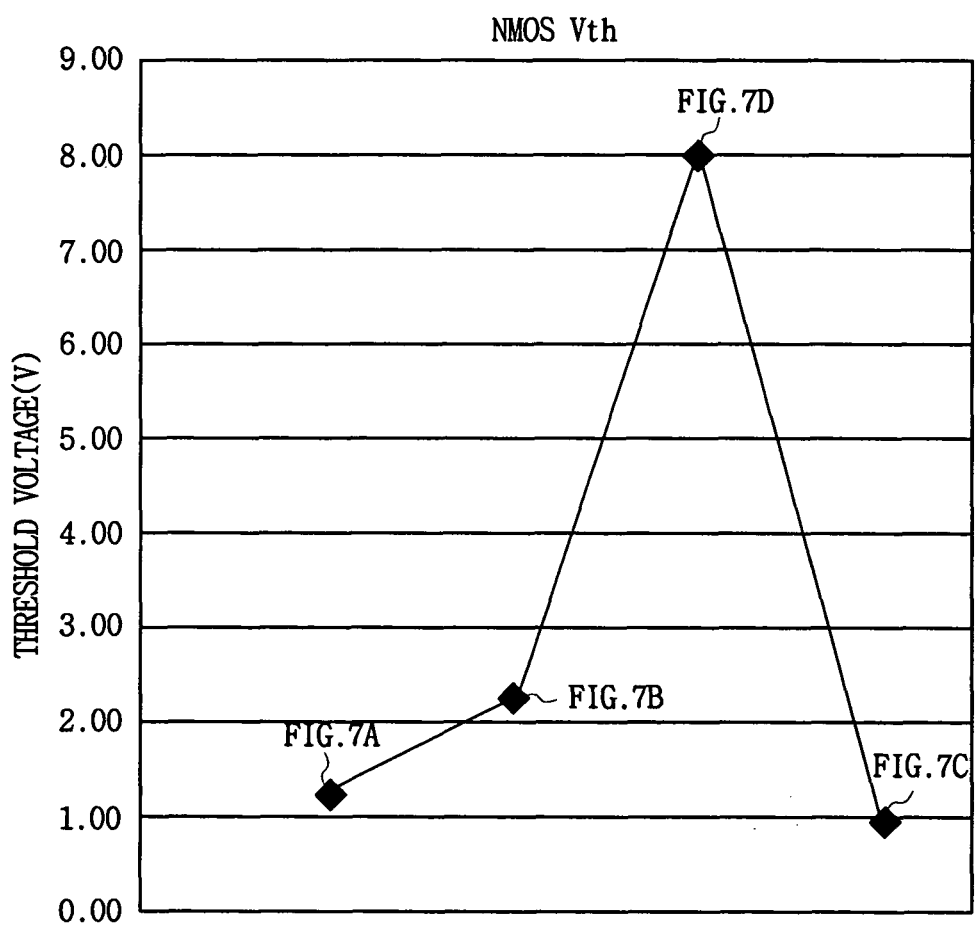
FIG. 8B shows a graph illustrating threshold voltage values of the N-type TFT employing polysilicon having the crystalline shapes of FIGS. 7A and 7B.

FIG. 8A shows a graph illustrating threshold voltage values of the P-type TFT employing the polysilicon film having the crystalline shapes as represented in FIGS. 7A, 7B, 7C and 7D. FIG. 8B show a graph illustrating threshold voltage values of the N-type TFT employing the polysilicon film having the crystalline shapes as represented in FIGS. 7A, 7B, 7C and 7D. The threshold voltage values are presented in Table 1 as follows.

TABLE 1

| Grain shape | P-type TFT Vth (Voltage) | N-type TFT Vth (Voltage) |
| --- | --- | --- |
| FIG. 7A (anisotropy) | −4.82 | 1.41 |
| FIG. 7B (anisotropy) | −4.01 | 2.34 |
| FIG. 7C (anisotropy) | −5.84 | 0.92 |
| FIG. 7D (isotropy) | −11.60 | 7.90 |

Referring to Table 1 and FIGS. 8A and 8B, it is shown that the absolute values of the threshold voltages Vth of the P-type TFT and the N-type TFT in case of FIGS. 7A to 7C having substantially anisotropic crystalline shape are smaller than the absolute value of the threshold voltage in case of FIG. 7D having a substantially isotropic crystalline shape. When small differences of absolute threshold voltages are desired between P-type and N-type TFTs, the P-type TFT should employ a substantially anisotropic crystalline shape and the N-type TFT should employ a substantially isotropic crystalline shape.

Referring to FIGS. 7A, 7B, 7C and 7D, the anisotropic crystal shape of FIG. 7A has a substantially hexagonal-like shape. The crystal shape of FIG. 7B is a substantially anisotropic cylindrical shape. The crystal shape of FIG. 7C is a substantially rectangular shape. The substantially isotropic crystal shape of FIG. 7D is a substantially equiaxed shape.

In the present invention, the polysilicon in the N-type and P-Type TFTs included in the active channel region may have different grain shapes. These TFTs may be used in a number of different flat panel display devices, for example, they may be used in an active device type LCDs, organic electroluminescent display devices, or the like.

As described hereinabove, the flat panel display device comprising a polysilicon TFT in accordance with the present invention is capable of satisfying required electrical characteristics. This may accomplished by varying grain sizes of the polysilicon included in the active channel region and/or by varying laser energy irradiated on the driving circuit portion and the pixel portion in the crystallization of the amorphous silicon.

Additionally, the present invention is capable of providing a CMOS TFTs having improved electrical characteristics. For example, CMOS TFTs having absolute values of the threshold voltages and current mobility controlled by varying the number of the "primary" grain boundaries in the active channel regions of the N-type and P-type TFTs.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A flat panel display device, comprising:
a pixel portion including a plurality of thin film transistors, wherein the plurality of thin film transistors are driven by signals applied through a gate line and a data line; and
a driving circuit portion having at least one thin film transistor to apply the signals to the pixel portion and connected to the gate line and the data line, wherein an average number of polysilicon grains per unit area formed in an active channel of the at least one thin film transistor is less than an average number of polysilicon grains formed in an active channel of one of the plurality of thin film transistors included in the pixel portion,
wherein polysilicon grains are defined by primary grain boundaries,
wherein a current mobility in the driving circuit portion is larger than a current mobility in the pixel portion, and
wherein the polysilicon grains formed in the active channel region of the pixel portion are more uniform than the polysilicon grains formed in the active channel region of the driving circuit portion.

2. The flat panel display device of claim 1, wherein an average particle size of the polysilicon grains formed in the active channel region is larger in the driving circuit portion than in the pixel portion.

3. The flat panel display device of claim 1, wherein the flat panel display device is an organic electroluminescent display device.

4. The flat panel display device of claim 1, wherein the flat panel display device is a liquid crystal display device.

5. A flat panel display device, comprising:
a P-type thin film transistor having a polysilicon grain structure of a substantially anisotropic shape formed in an active channel region; and
a N-type thin film transistor having a polysilicon grain structure of a substantially isotropic shape formed in an active channel region, and
wherein an absolute value of a threshold voltage of the P-type thin film transistor is smaller than an absolute value of a threshold voltage of the N-type thin film transistor.

6. The flat panel display device of claim 5, wherein the flat panel display device is an organic electroluminescent display device.

7. The flat panel display device of claim 5, wherein the flat panel display device is a liquid crystal display device.

8. A complementary metal oxide semiconductor (CMOS), comprising:
a P-type thin film transistor having a polysilicon grain structure of a substantially anisotropic shape formed in an active channel region; and
a N-type thin film transistor having a polysilicon grain structure of a substantially isotropic shape formed in an active channel region, and
wherein an absolute value of a threshold voltage of the P-type thin film transistor is smaller than an absolute value of a threshold voltage of the N-type thin film transistor.

9. The complementary metal oxide semiconductor (CMOS) of claim 8, wherein particle sizes of the grain structure of the substantially anisotropic shape are larger than the particle sizes of the grain structure of the substantially isotropic shape.

10. The complementary metal oxide semiconductor (CMOS) of claim 8, wherein average particle sizes of the grain structure having the substantially isotropic shape is less than or equal to about 1 μm.

11. The complementary metal oxide semiconductor (CMOS) of claim 10, wherein the average particle sizes of the grain structure having the substantially anisotropic shape is more than or equal to about 2 μm.

12. The complementary metal oxide semiconductor (CMOS) of claim 8, wherein the polysilicon grain structure formed in the active channel of the P-type thin film transistor is formed by sequential lateral solidification (SLS), and the polysilicon grain structure formed in the active channel of the N-type thin film transistor is formed with an excimer laser.

13. The complementary metal oxide semiconductor (CMOS) of claim 8, wherein the polysilicon grain structure formed in the active channel of the P-type and N-type thin film transistors are formed by laser crystallization and energy irradiated in the active channel of the P-type thin film transistor is larger than energy irradiated in the active channel of the N-type thin film transistor.

14. The complementary metal oxide semiconductor (CMOS) of claim 8, wherein the substantially anisotropic crystal shape is one of a substantially hexagonal shape, a substantially cylindrical shape, or a substantially rectangular shape, and the substantially isotropic crystal shape is a substantially equiaxed shape.

15. The complementary metal oxide semiconductor (CMOS) of claim 8,
wherein an energy level used to irradiate the active region of the P-type thin film transistor is larger than an energy level used to irradiate the active region of the N-type thin film transistor, and
wherein an average size of grain particles in the active region of the P-type thin film transistor is larger than an average size of grain particles in the active region of the N-type thin film transistor.

* * * * *